United States Patent
Kim et al.

(10) Patent No.: US 11,050,965 B1
(45) Date of Patent: Jun. 29, 2021

(54) IMAGE SENSOR AND IMAGE RECOGNITION APPARATUS USING THE SAME

(71) Applicant: GWANGJU INSTITUTE OF SCIENCE AND TECHNOLOGY, Gwangju (KR)

(72) Inventors: Wootae Kim, Gwangju (KR); Byung-Geun Lee, Gwangju (KR); Hyun-Keun Lee, Gwangju (KR); Jung-Gyun Kim, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 16/823,075

(22) Filed: Mar. 18, 2020

(51) Int. Cl.
*H04N 5/378* (2011.01)
*H04N 5/232* (2006.01)
*H03M 3/00* (2006.01)
*G06N 3/02* (2006.01)

(52) U.S. Cl.
CPC ............ *H04N 5/378* (2013.01); *G06N 3/02* (2013.01); *H03M 3/462* (2013.01); *H03M 3/474* (2013.01); *H04N 5/23245* (2013.01)

(58) Field of Classification Search
CPC ......... H04N 5/378; G06N 3/02–3/105; H03M 3/458–3/498
See application file for complete search history.

(56) References Cited

U.S. PATENT DOCUMENTS

| | | | |
|---|---|---|---|
| 9,509,332 B1* | 11/2016 | Garrity | H03M 3/472 |
| 2015/0195470 A1* | 7/2015 | Millet | H04N 5/378 |
| | | | 348/308 |
| 2016/0093019 A1* | 3/2016 | Ayers | H04N 9/045 |
| | | | 382/299 |
| 2020/0344428 A1* | 10/2020 | Lee | H04N 5/3745 |

FOREIGN PATENT DOCUMENTS

| | | |
|---|---|---|
| KR | 101741754 B1 | 5/2017 |
| KR | 20180083030 A | 7/2018 |
| WO | 2018025116 A1 | 2/2018 |

OTHER PUBLICATIONS

Ashkan Olyaei, "Focal-Plane Spatially Oversampling CMOS Image Compression Sensor" (Year: 2007).*
Tianrui Ma, Kaige Jia, Xin Zhu, Fei Qiao, Qi Wei, Huichan Zhao, Xinjun Liu, Huazhong Yang, "An Analog-Memoryless Near Sensor Computing Architecture for Always-On intelligent Perception Applications" (Year: 2019).*

* cited by examiner

*Primary Examiner* — Paul M Berardesca
(74) *Attorney, Agent, or Firm* — Loza & Loza, LLP; Heidi Eisenhut

(57) ABSTRACT

Disclosed is an image sensor including pixels, and an analog digital converter configured to select output values of the pixels using an analog multiplexer and to simultaneously perform a convolution operation and conversion into a digital signal using a delta-sigma ADC. The size of processed data is reduced, and power consumption is reduced, and thus the image sensor is advantageously applied to a portable device.

6 Claims, 4 Drawing Sheets

FIG. 7

|  | OPS | CPU | GPU | FPGA | This Work |
|---|---|---|---|---|---|
| Model | | Xeon E5-2640 | NVIDIA Tesla K40 | Maxeler MPC-X2000 Stratix V | CIS with DSM & SW Kernel |
| Price($) | 200M | 970.36 | 1,798 | 6,995(↑) | - |
| Time(ms) | | 0.79 | 0.35 | 1 | 38.36 |
| Power(W) | | 95/4.75 | 235/11.75 | 26.2/1.31 | 0.015 |
| GOPS/s | | 253.2 | 571.4 | 200 | 5.21 |
| GOPS/s/W | | 53.31 | 48.63 | 152.7 | 347.33 |

IMAGE SENSOR AND IMAGE RECOGNITION APPARATUS USING THE SAME

FIELD

The present disclosure relates to an image sensor and an image recognition apparatus using the same.

BACKGROUND

An image sensor is a device for acquiring an image in units of pixels.

Recently, the image sensor has expanded to various fields as well as uses of a digital camera instead of a normal film camera. For example, image classification for recognizing an image captured by an image sensor has become important technological factors in various industrial fields such as an autonomous driving camera, a black box, or a monitor camera.

Along with demands for such technical convergence, research has been conducted to configure a neural network and an image sensor into single hardware. When image classification hardware configured by integrating the neural network and the image sensor is designed, it is required to rapidly process a significant amount of data.

The processed data may be classified into output data from a first image sensor and data generated via calculation inside a second neural network. Data processing in the neural network may use a binarized neural network (BNN) structure for binarizing and calculating the accuracy of a weight, thereby reducing a computational load inside a network and a capacity of a memory. For example, Korean Patent Publication No. 10-2017-0004379 discloses the 'Convolution neural network system with binary parameter and operating method thereof' and advantages thereof.

Although a neural network part is configured as a binarized neural network (BNN) in the image classification hardware, an output amount of image data output from an image sensor is not changed. Thus, due to an increase in the amount of data in an interface between the image sensor and the neural network, a size of an input terminal of the binarized neural network (BNN) is increased, and thus, there is a problem in that computational load is increased and a required capacity of a memory is increased.

These problems have become more serious in an application with limited power consumption such as a portable device.

RELATED ART DOCUMENTS

Patent Document (Related Art 1) Korean Patent Publication No. 10-2017-0004379 'Convolution neural network system with binary parameter and operating method thereof'.

SUMMARY

An object of the present disclosure is to provide an image sensor and an image recognition apparatus using the same for reducing the amount of data input to a neural network.

Another object of the present disclosure is to provide an image sensor and an image recognition apparatus using the same for reducing the amount of data output from the image sensor to reduce system load and energy consumption.

The present disclosure provides an image sensor including pixels, an analog multiplexer configured to perform convolution on an analog signal of the pixels, and an analog digital converter configured to perform summing and conversion on the analog signal output from the analog multiplexer into a digital signal. According to the present disclosure, the size of output data may be reduced.

The analog multiplexer may be embodied in a switch matrix form, and thus energy consumption in an image sensor rarely occurs, and thus, may be more appropriately applied to a portable device. The analog digital converter may simultaneously perform a convolution operation and conversion into a digital signal using the delta-sigma ADC, on values selected using the analog multiplexer among output values of the pixels.

The analog digital converter may be a delta-sigma ADC, and the delta-sigma ADC includes a first stage, a second stage configured to additionally process an output signal of the first stage, a decimation filter provided in an output end, and a mode switch configured to determine whether to operate the second stage. Accordingly, a mode of an image output from a single image sensor may be adjusted. The mode may include a normal photograph mode in which the second stage is operated, and a binarized neural network (BNN) mode in which the second stage is not operated. Thus, although a single device is used, an effect may be achieved as if two image sensors are used.

An image recognition apparatus according to the present disclosure may include an image sensor configured to process convolution in an output value of a pixel in an analog region, and a binarized neural network (BNN) configured to process a digital signal output from the image sensor. Thus, data throughput may be reduced, and energy consumption may be advantageously reduced to be appropriate for a portable device.

BRIEF DESCRIPTION OF THE DRAWINGS

FIG. 7 is a table showing comparison of computation efficiency according to an embodiment.

DETAILED DESCRIPTION

Hereinafter, embodiments of the present disclosure will be explained in detail with reference to the attached drawings. However, the present disclosure should not be construed as being limited to the embodiments set forth herein and one of ordinary skilled in the art would be obvious that other embodiments included in the scope of the present disclosure are easily proposed via addition, changes, deletion, and supplement of components and are included in the scope of the spirit of the present disclosure.

Figure 1:
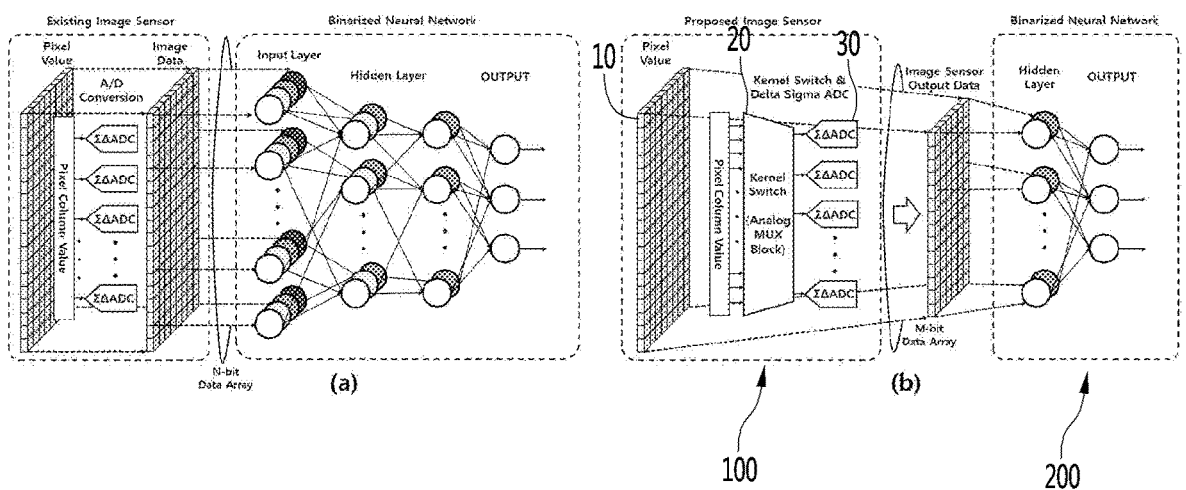
FIG. 1 is a diagram illustrating a concept of an image recognition apparatus using an image sensor.

FIG. 1 is a diagram illustrating a concept of an image recognition apparatus using an image sensor. FIG. 1A is a diagram illustrating a concept of an image recognition apparatus configured by coupling a conventional image sensor and a binarized neural network (BNN). FIG. 1B is a diagram illustrating a concept of an image recognition apparatus using an image sensor according to an embodiment of the present disclosure.

As seen from FIG. 1A, an output data amount (N bit) from an image sensor is larger, and thus, computational load of the binarized neural network (BNN) is increased.

In contrast, as seen from FIG. 1B, data (M bit, N>M) that is output through a convolution operation inside an image sensor 100 may be output and the computational load of the binarized neural network (BNN) may also be reduced.

In more detail, the image recognition apparatus using an image sensor according to an embodiment may include the image sensor 100, and a binarized neural network (BNN) 200. In addition, the image recognition apparatus may further include other devices such as a discriminator, a notifier, or a memory, and these components may be other devices that are well known.

The image sensor 100 may include an analog multiplexer 20 for performing a convolution operation on analog information acquired from pixels 10 provided to an imaging device, and a delta-sigma ADC 30 for converting an analog signal output from the analog multiplexer 20 into a digital signal.

A concept of an operation of the image sensor 100 will be described with reference to FIG. 2.

Figure 2:
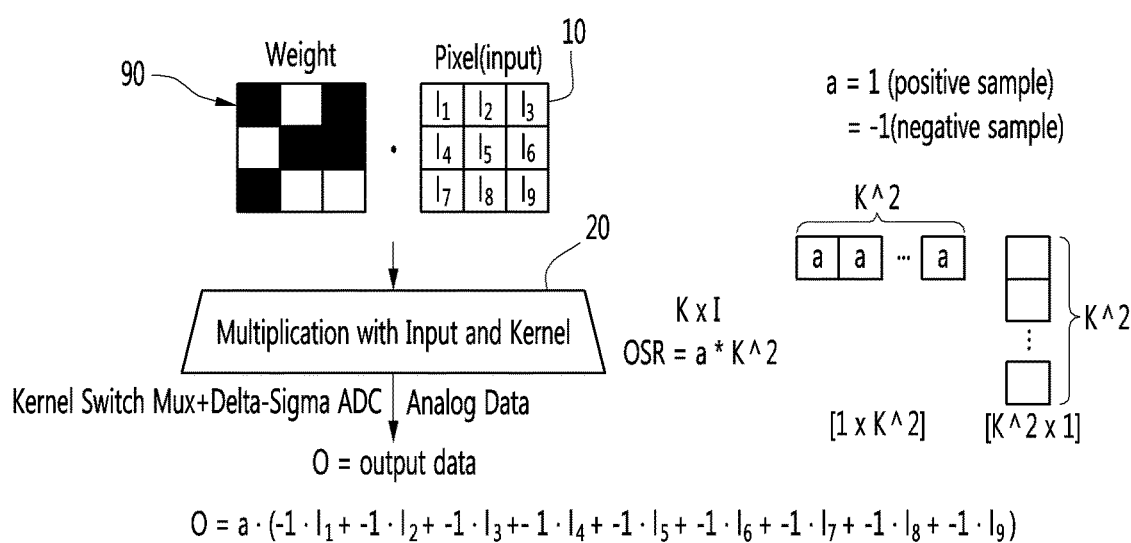
FIG. 2 is a diagram illustrating a concept of multiplication of a binary weight and a pixel value and a convolution operation using a delta-sigma analog digital converter.

FIG. 2 is a diagram illustrating a concept of convolution performed by a hardware device inside an image sensor. The drawing illustrating convolution using an analog multiplexer and a delta-sigma ADC with respect to 3×3 pixels and a weight of 3×3.

As seen from FIG. 2, output of the delta-sigma ADC is output as a value obtained by summing values obtained by multiplying a weight of a weight matrix 90 and values of the pixels 10. The weight may be given by a value of 1 and −1. Thus, the weight may be embodied by an analog circuit.

Each weight of the weight matrix may be embodied as a plurality of analog switches that are arranged in series and in parallel to each other, that is, a switch matrix, and may be provided as a structure based on a barrel shifter. In other words, the analog multiplexer 20 may be configured with the switch matrix.

The weight matrix may be predetermined depending on a type of the image recognition apparatus. For example, any switch matrix for a weight matrix appropriate for vehicle recognition may be provided as long as the switch matrix is used in vehicle recognition in autonomous driving.

Figure 3:
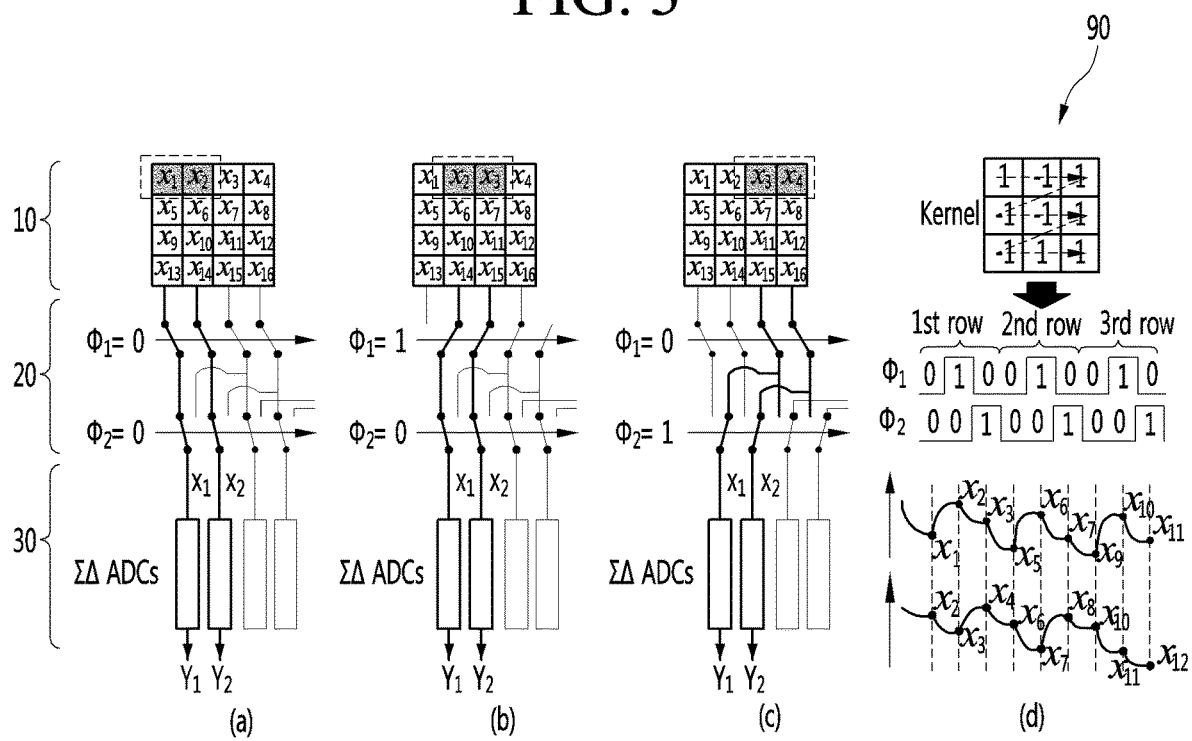
FIG. 3 is a diagram for explaining a detailed operation of an analog multiplexer for applying a binary weight.

FIG. 3 is a diagram for explaining a concept of FIG. 2 in more detail and illustrates a procedure of performing a convolution operation of pixels and a weight of 3×3 using a switch and a delta-sigma analog digital converter. Here, the small letter x is a value of each pixel, the capital letter X is a value sampled by the delta-sigma ADC 30 as output of the analog multiplexer 20, Y is a value output from the delta-sigma ADC 30, and $\Phi_1$ and $\Phi_2$ are signals for controlling the analog multiplexer 20.

In FIG. 3, (a), (b), and (c) are listed in a time sequence, and (d) is a voltage of each node according to time. A weight may be configured by an analog multiplexer, a left column may be selected when the weight is 0, and a right column may be selected when the weight is 1.

First, (a) of FIG. 3 illustrates a situation in which signals of $\Phi_1$ and $\Phi_2$ are 0 and 0, respectively, in which case a weight of 1 is applied, and a value of each point is an analog multiplexer output value $X_1=x_1$ and $X_2=x_2$ and a digital output value $Y_1=x_1$ and $Y_2=x_2$.

Then, (b) of FIG. 3 illustrates a situation in which signals of $\Phi_1$ and $\Phi_2$ are 1 and 0, respectively, in which case a weight of −1 is applied, and a value of each point is an analog multiplexer output value $X_1=x_2$ and $X_2=x_3$ and a digital output value $Y_1=x_1-x_2$ and $Y_2=x_2-x_3$.

Then, (c) of FIG. 3 illustrates a situation in which signals of $\Phi_1$ and $\Phi_2$ are 0 and 1, respectively, in which case a weight of 1 is applied, and a value of each point is an analog multiplexer output value $X_1=x_3$ and $X_2=x_4$ and a digital output value $Y_1=x_1-x_2+x_3$ and $Y_2=x_2-x_3+x_4$.

The aforementioned method may be applied in the same way to the remaining weights of FIG. 3 and may also be applied to weights of other combinations. A computational operation of a negative weight (−1) will be described with reference to FIG. 5.

Figure 4:
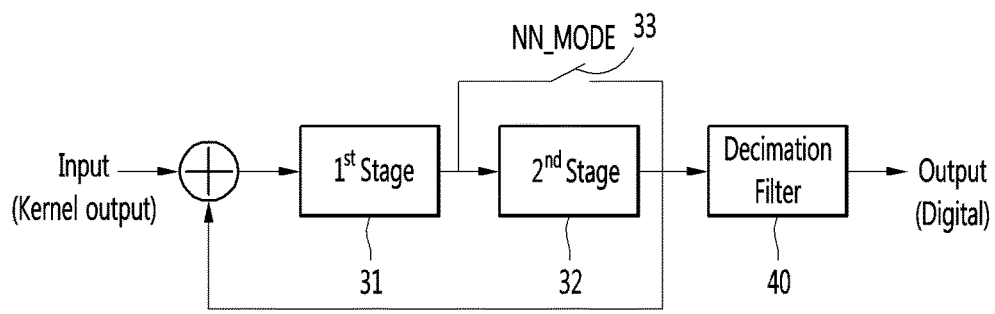
FIG. 4 is a block diagram of a delta-sigma ADC.

FIG. 4 is a block diagram of a delta-sigma ADC according to an embodiment.

Referring to FIG. 4, the delta-sigma ADC according to an embodiment may be a delta-sigma ADC of an amp sharing method using self-bias for a low-power operation and may include a first stage 31, a second stage 32, a mode switch 33 for determining an operation of the second stage 32, and a decimation filter 40.

The delta-sigma ADC 30 may be operated at first or second order depending on a control state of the mode switch 33. The mode switch 33 may be manipulated according to an external control signal (NN_MODE signal). According to the present control signal, a binarized neural network mode (BNN mode) and a normal photograph mode may be switched with each other. To this end, the NN_MODE signal may perform a function of inputting output of the first stage 31 to the decimation filter 40 and may enable and disable the second stage 32.

The delta-sigma ADC 30 may be operated as a primary delta-sigma ADC for a convolution operation in the BNN mode. This is because it is not appropriate to apply a secondary delta-sigma ADC to a convolution operation since a unique weight is generated during a switching procedure.

The delta-sigma ADC 30 may be operated as the secondary delta-sigma ADC in order to acquire a high-resolution image in the normal photograph mode. To this end, an over sampling rate (OSR) of the ADC may be adjusted.

Figure 5:
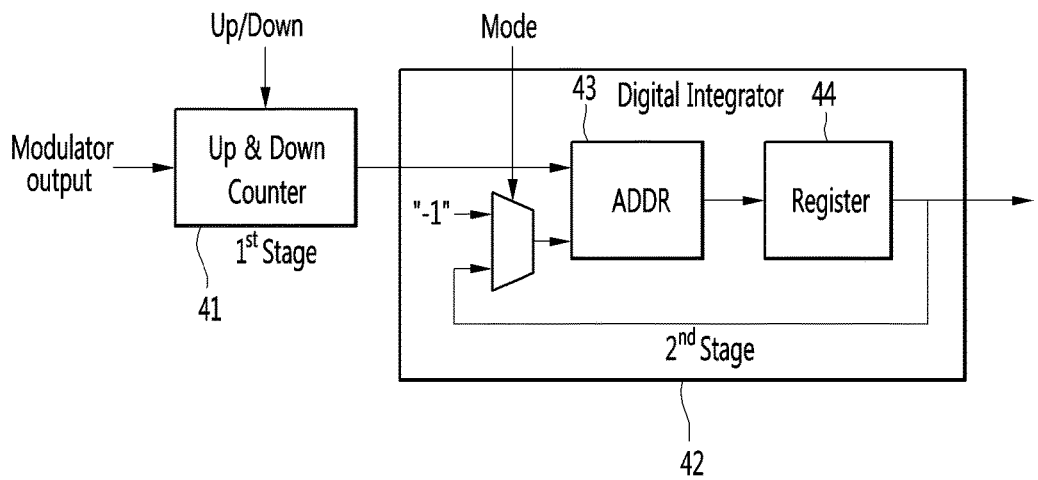
FIG. 5 is a block diagram of a decimation filter for calculating a weight of −1.

FIG. 5 is a block diagram of a decimation filter for an operation of an analog digital converter, in which an order is changed depending on an operating mode of an image sensor, and for applying a weight of −1.

Referring to FIG. 5, the delta-sigma ADC 30 may be primarily operated in a binarized neural network mode (BNN mode), and thus, an adder 43 of a second stage 42 of the decimation filter 40 may add 0 according to a mode signal and may output a result of a first stage 41 without change. Here, a negative weight (−1) may be embodied using the first stage 41 of the decimation filter 40 as an ascending/descending adder.

Figure 6:
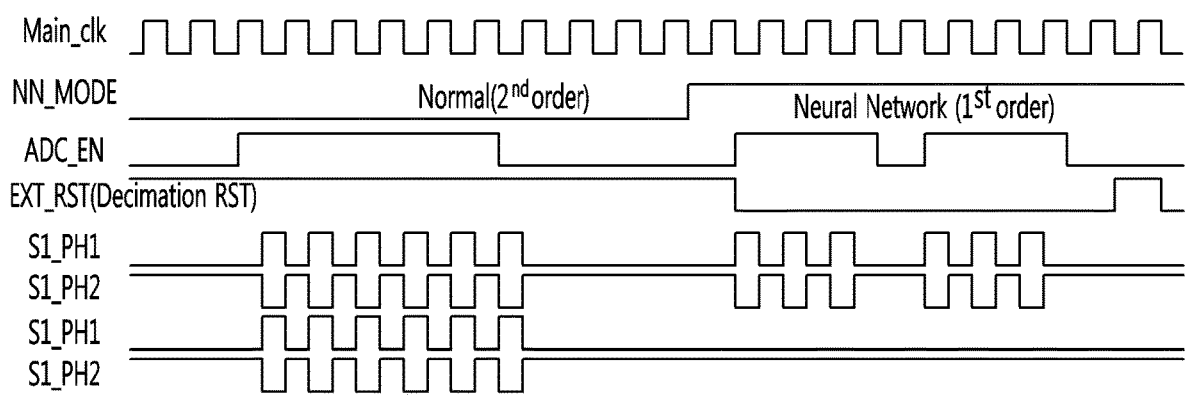
FIG. 6 is a timing diagram for operating an analog digital converter and a decimation filter.

FIG. 6 is a diagram illustrating a control signal according to a photograph mode of a delta-sigma ADC.

As described above, an image sensor according to an embodiment may be operated in two modes that are classified into a normal photograph mode (NN_MODE="0") and a binarized neural network mode (NN_MODE="1") according to the NN_MODE signal.

In the normal photograph mode, the image sensor may be secondarily operated to finely digital-convert an output voltage of a pixel like in a normal image sensor.

The binarized neural network mode requires characteristics of simply summing sampled signals of the ADC, and thus, it may be required to disable the second stage 32. Thus, signals S2_PH1 and S2_PH2 are fixed to a constant value.

In the binarized neural network mode, initialization of an analog digital converter may be controlled by EXT_RST.

FIG. 7 is a table showing computation efficiency according to an embodiment and shows comparison of CPU, GPU, FPGA, and embodiments with respect to convolution operations of 2 million times in consideration of power consumption. As seen from FIG. 7, the embodiment of the present disclosure has excellent computation performance based on power consumption compared with CPU, GPU, and FPGA.

As described in detail above, with regard to a conventional image sensor, since image sensor and neural network functional chips are each developed and are integrated into each other, a weight is adjusted in a digital manner, and thus, power consumption in an analog area may not be reduced.

According to the present disclosure, a neural network image sensor that is easily variable to 1 to N bits may be embodied using a delta-sigma ADC and a kernel convolution matrix.

According to the present disclosure, an image sensor for a BNN may be applied to enable low power consumption and a rapid operation. In addition, an NN mode and a normal mode may be easily switched with each other to acquire a normal high-resolution image as well as an NN application.

The present disclosure may be used to various application fields such as pattern classification), IoT, and a vision sensor for autonomous driving, and may be advantageously embodied by slightly changing a conventional structure.

The image sensor and the image recognition apparatus according to the present disclosure may be applied to an image classification function like in a mobile, vehicle, or image monitoring field, and more particularly, may be applied to a mobile device that requires a small amount of energy consumption.

According to the present disclosure, a convolution function of a binarized neural network may be added to an image sensor to reduce the amount of data output from the image sensor. Thus, computational load processed in the binarized neural network and capacity of a memory may be reduced.

According to the present disclosure, a weight of a binarized neural network may be configured with 1 and −1, and thus a convolution operation in an image sensor may be simply embodied almost without power consumption using an analog multiplexer (MUX) and a delta-sigma ADC.

A conventional image sensor and a neural network may cause power consumption in each of image production and an convolution operation, but according to the present disclosure, a combination of the analog multiplexer (MUX) and the delta-sigma ADC may perform the convolution operation in an analog region and may perform multiplication and sum of weights simultaneously with analog digital conversion, and thus, it may be possible to perform the convolution operation using only energy for producing an image by the conventional image sensor, thereby achieving excellent hardware than hardware using the conventional image sensor in terms of power efficiency.

According to the present disclosure, the analog mulitiplexer (MUX) may be controlled to switch between a binarized neural network mode (BNN mode) and a normal photograph mode. Thus, although a single device is used, an effect may be achieved as if two image sensors are used.

What is claimed is:

1. An image sensor comprising:
   pixels;
   an analog multiplexer configured to select an analog output signal of the pixels; and
   an analog digital converter configured to convert the analog signal output from the analog multiplexer into a digital signal and to output the digital signal;
   wherein the analog multiplexer includes a switch, the analog multiplexer is configured in a matrix form, and a pixel for performing a convolution operation is selected;
   wherein the analog digital converter is a delta-sigma ADC;
   wherein the delta-sigma ADC includes:
      a first stage;
      a second stage configured to additionally process an output signal of the first stage;
      a decimation filter provided in an output end and configured to apply a weight; and
      a mode switch configured to determine whether to operate the second stage; and
   wherein the mode switch switches:
      a normal photograph mode in which the second stage is operated; and
      a binarized neural network (BNN) mode in which the second stage is not operated.

2. The image sensor of claim 1, wherein the analog multiplexer includes a weight matrix including a plurality of switches that are arranged in series and in parallel.

3. The image sensor of claim 2, wherein a weight of the weight matrix is determined based on a signal for controlling the analog multiplexer.

4. The image sensor of claim 1, wherein the delta-sigma ADC outputs a value obtained by summing values obtained by multiplying a weight of a weight matrix and values of the pixels; and
   wherein the weight of the weight matrix is configured with 1 or −1.

5. The image sensor of claim 1, wherein the analog multiplexer, the delta-sigma ADC, and the decimation filter are combined and perform a convolution operation.

6. An image recognition apparatus including the image sensor of claim 1, further including a binarized neural network for processing a digital signal output from the image sensor.

\* \* \* \* \*